United States Patent [19]

James

[11] Patent Number: 5,358,825

[45] Date of Patent: Oct. 25, 1994

[54] MANUFACTURE OF PRINTED CIRCUIT CONDUCTORS BY A PARTIALLY ADDITIVE PROCESS

[75] Inventor: David B. James, Newark, Del.

[73] Assignee: AMP-Akzo Corporation, Newark, Del.

[21] Appl. No.: 36,307

[22] Filed: Mar. 24, 1993

[51] Int. Cl.$^5$ .......................... G03C 5/00; H05K 3/00
[52] U.S. Cl. ................................... 430/271; 430/311; 430/313; 430/327; 427/98
[58] Field of Search ............... 430/270, 271, 275, 280, 430/311, 313, 327; 427/98; 428/901

[56] References Cited

U.S. PATENT DOCUMENTS

| | | | |
|---|---|---|---|
| 4,643,793 | 2/1987 | Nakaso et al. | 156/306.6 |
| 4,693,959 | 9/1987 | Ashcraft | 430/323 |
| 4,837,086 | 6/1989 | Takahashi | 428/506 |
| 5,028,513 | 7/1991 | Murakami et al. | 430/315 |
| 5,091,283 | 2/1992 | Tanaka et al. | 430/280 |
| 5,100,767 | 3/1992 | Yanagawa et al. | 430/280 |
| 5,153,987 | 10/1992 | Takahashi | 29/852 |
| 5,268,255 | 12/1993 | Kikuchi | 430/280 |

*Primary Examiner*—Marion E. McCamish
*Assistant Examiner*—Kathleen Duda
*Attorney, Agent, or Firm*—Richard P. Fennelly; Louis A. Morris

[57] ABSTRACT

The adhesion of epoxy-resin containing resist compositions to a copper surface, which resist compositions are exposed to actinic radiation, developed and hardened, is enhanced by contacting the copper surface with an N-heterocyclic compound comprising —NH$_2$ groups and drying the copper surface comprising the N-heterocyclic compound prior to application of the resist. Printed wiring boards produced by a partially additive process can be produced using this adhesion enhancement technique.

10 Claims, No Drawings

MANUFACTURE OF PRINTED CIRCUIT CONDUCTORS BY A PARTIALLY ADDITIVE PROCESS

FIELD OF THE INVENTION

This invention relates to adhesion promoting compositions on surfaces of copper and methods for producing thermal stress resistant copper conductors for printed circuit boards. In particular, this invention relates to the field of printed wiring boards produced by a partially additive process.

BACKGROUND OF THE INVENTION

Printed circuit boards can fail by breaks in the copper conductive pattern caused by the stresses induced by the difference between the thermal expansion of the copper conductive pattern and the insulating substratum to which it is attached. Thermal stresses occur when components are joined to the conductive pattern by soldering at temperatures from 200° to 300° C. The printed circuit industry has recognized this problem by imposing thermal stress test and tensile requirements on printed circuit boards.

MIL-P-55110 D specifications require the printed circuit boards to be thermally stressed by application of molten solder at 288° C. for ten seconds. After soldering, holes in the test board are microsectioned and examined with a 100x microscope. The resistance to thermal stress is evaluated by assigning a crack rating on a scale of 0 to 160 with ratings above 15 being considered a failure of the test. Since there may be more than one soldering cycle in the assembly of a printed circuit, some electronic equipment manufacturers have required suppliers of printed wiring boards to test the boards by four repetitive thermal stress cycles at 288° C.

IPC TECHNICAL REPORT, IPC-TR-579, ROUND ROBIN RELIABILITY EVALUATION OF SMALL DIAMETER PLATED THROUGH HOLES IN PRINTED WIRING BOARDS, Lincolnwood, Ill.: Institute for Interconnecting and Packaging Electronic Circuits, 1988, p. 25, describes thermal cycling between 25° C. and 260° C. in a Fluid Sand T-Shock test. The boards are cycled to failure, which is an open circuit or a 10% increase in the resistance of a chain of plated-through holes. Five cycles without failure is considered acceptable.

Printed circuit boards comprise epoxy resin dielectrics adjacent to copper surfaces for various functions. Joining layers between inner layer conductors of multilayer printed circuit boards comprise epoxy resin containing polymers. Epoxy resin dielectrics are often used as solder resists and as plating resists for defining conductor patterns. In the manufacture of printed circuit boards by a partially additive process the resists are required to firmly adhere to copper surfaces even after several hours of plating in an electroless copper solution at elevated temperatures and high pH.

It is difficult to permanently bond copper surfaces and such resists together. The electroless plating solutions employed have a tendency to penetrate between the copper surface and the resist film due to the long duration of electroless plating. The resist films lift during plating, leaving voids and allowing plating solutions to penetrate between the copper surface and the resist layer, thus rendering the resulting printed circuit board unreliable.

To avoid these problems, methods have been disclosed in which adhesion promoting substances are employed, either between the copper surfaces and the resist layers, or as components of the resist layers to be adhered to the copper surfaces.

An elucidation of the partially additive process to which the present invention is applicable, to the extent that the subsequent description does not specifically describe such a process, is to be found in Printed Circuits Handbook, 3rd Edition, Chapter 13, Clyde F. Coombs, ed., McGraw-Hill, New York (1988), which is incorporated herein by reference.

U.S. Pat. No. 5,028,513 to Murakami et al. discloses the addition of benzotriazole and other related compounds into a plating resist for improving adherence of the resist to a copper conductor. Murakami et al. recognize the deleterious effects of benzotriazole and certain S-triazine compounds on the performance of an electroless copper bath and the adverse affects of these same compounds on the electroless copper deposits formed therefrom. There is however, no teaching in Murakami et al. for applying S-triazine compounds directly to the surface of unroughened copper. Moreover, Murakami et al. suggest the use of sublimable S-triazine compounds, while the present invention does not require such usage.

U.S. Pat. No. 5,091,283 to Tanaka et al. discloses the incorporation of S-triazine compounds into plating resists useful in a partially additive manufacturing process. Tanaka et al. recognize that such plating resists may peel from copper surfaces immersed in an electroless plating solution, however Tanaka et al. teach the use of the S-triazines in combination with dicyandiamide solely as curing agents for the epoxy resin component of a dialkyl phthalate resist, and there is no recognition that the S-triazine derivatives are useful as adhesion promoting agents.

In another process, U.S. Pat. No. 4,693,959 to Ashcraft discloses plating resists comprising adhesion promoting polymers formed by condensation of formaldehyde and S-triazine compounds, and preferably a condensation polymer of formaldehyde and melamine. There is no teaching in Ashcraft for the use of such plating resists in electroless copper solutions.

In U.S. Pat. No. 5,100,767 to Yanagawa et al. S-triazine compounds are disclosed as latent photoresist hardeners which also have the effect of strengthening adhesion of the photoresist resist to copper. There is no recognition that S-triazine compounds will affect the performance of the electroless plating bath or the physical properties of the copper deposits, nor does Yanagawa et at. teach methods for circumventing these problems.

Partially additive processes using resists comprising S-triazine compounds have proven difficult to control. When the S-triazine compounds are employed in low concentration, or not present at all, adherence of the resist to the copper during subsequent electroless plating is poor.

At effective levels for promoting cure of the resist, elution of the adhesion promoting compounds from the resists into the electroless plating solutions results in the formation of copper films which are brittle and not useful for printed circuits.

Up to the time of the present invention, it has not been possible to use resists comprising S-triazine compounds of the type disclosed in Tanaka et al. in the manufacture of thermal stress resistant copper by a partially additive process. The S-triazine elutes into the electroless plating solution and the resultant copper deposits fail under thermal stress.

SUMMARY OF THE INVENTION

In its broadest aspect, the present invention comprises contacting a copper surface with an N-heterocyclic six membered ring compound comprising —NH$_2$ groups for firmly adhering an epoxy-resin containing dielectric layer thereto.

Another embodiment of the present invention comprises a method of providing an adhesion promoting layer comprising an S-triazine compound on the surface of copper, for firmly adhering to an epoxy-resin plating resist whereby thermal stress resistant copper deposits can be manufactured by electroless plating.

In another embodiment, the present invention comprises a process for manufacture of partially additive printed circuits wherein a plating resist adheres firmly to the copper without the necessity for adhesion promoting substances incorporated in the resist, whereby the conductors of a printed circuit board can be manufactured which are of high ductility and highly resistant to thermal stress.

DETAILED DESCRIPTION OF THE INVENTION

In a partially additive process a photoresist is applied to a cleaned copper surface of a printed wiring board by well-known techniques. Following imaging of the photoresist and electroless copper plating of the conductor pattern to the final desired thickness, the printed wiring board is heated for 1–2 hours at 140°–160° C. to remove absorbed moisture from the plating step, and increase the adhesion between the copper conductors and the base material. It has been found that when an S-triazine containing resist manufactured according to U.S. Pat. No. 5,100,767 to Tanaka et al. is employed in a partially additive process, the ductility of the copper plated on a stainless steel stratum in the presence of a said resist was considerably lower than copper plated on a stainless steel stratum in the absence of said resist. Copper plated on a stainless steel stratum in the presence of a S-triazine containing photoresist exhibited low ductility, as measured by elongation within the range of 3.8% to 4.1%. These low values are insufficient to meet the rigid standards imposed by the current industry specifications.

Copper conductors of plated through holes 0.0135" in diameter manufactured in accordance with the conventional partially additive process employing an S-triazine containing resist also exhibit corner stress cracks when tested in accordance with the thermal stress requirements of MIL-P-55110D. On an arbitrary scale of 0 to 160, with low numbers being more desirable, no copper conductor sample manufactured in the conventional process had a crack rating less than 76. When the conductors manufactured by the method above were subjected to the Fluid Sand T-Shock test of IPC-TR-579 no sample survived more than 2 repetitive cycles.

The novel method of manufacturing partially additive printed wiring boards according to the present invention uses an N-heterocyclic six membered ring compound applied directly to the copper surface. Said compounds can comprise —NH$_2$ groups. Examples of said N-heterocyclic six membered ring compounds are 2,4,6-triamino-S-triazine (hereinafter called by the generic name of "melamine"), condensation polymers of formaldehyde with melamine, and 2,4-diamino-6-(2'-methylimidazolyl-(1'))ethyl-s-triazine. The terminology "N-heterocyclic six membered ring compound" is intended to cover compounds which comprise such a ring structure as the "nucleus" of such compound. Hence, both unsubstituted as well as substituted compounds of this type are intended to be covered.

In general, N-heterocyclic six membered ring compounds comprising —NH$_2$ groups will be useful in the present invention if they combine the function of being able to coordinate to copper and the function of being reactive with epoxy resin compounds in the same molecule.

In the present invention, application of the N-heterocyclic compound directly to the copper surface prior to application of a resist absent said N-heterocyclic compound, enables a marked and surprising improvement in the thermal stress resistance and tensile properties of an electroless copper deposit plated in the presence of such a resist. Prior to application of a resist, the copper surface is contacted with said N-heterocyclic compound by any techniques known to those skilled in the art, preferably by spraying a solution comprising said N-heterocyclic compound onto the copper surface and most preferably by immersion of the copper surface into an aqueous solution comprising said N-heterocyclic compound.

The aqueous solutions may comprise organic solvents to promote solubility of the N-heterocyclic compound. Because N-heterocyclic compounds are poorly soluble in solvents having low dielectric constants, more effective solvents include N-methyl pyrolidinone, butyl carbitol, isopropanol and similar solvents. N-heterocyclic compound concentrations in the range from 0.1 wt % to 3.0 wt % are effective with the most preferable embodiment employing an aqueous solution of 0.2 wt % melamine. Preferably, the solution is maintained at 40° C., however solution temperatures in the range of 20° C. to 80° C. are effective.

The N-heterocyclic compounds have been applied from acidic, neutral and basic solutions within the pH range of 2 to 13 with the most preferable solutions having a pH of about 7.2.

Optionally, the solution may contain a surfactant or wetting agent to promote uniform coating of the copper surface. One milligram per liter of coating solution of Pluronic L64 surfactant (BASF) has been used without adversely affecting adhesion. Inclusion of the surfactant is not necessary in the most preferable embodiment of the present invention.

Following application of the melamine, the copper surface is then dried to remove excess moisture, the drying step occurring without prior rinsing of the copper surface. Drying temperatures of up to 100° C. for periods of up to one hour are effective.

Following this treatment, an epoxy resist, free of elutable hardeners is applied to the copper conductors of a printed wiring board by any method well-known to those skilled in the art, and preferably by screen printing. Following imaging of the photoresist and electroless copper plating to the final desired thickness, the printed wiring board is heated for 1–2 hours at 140°–160° C. to remove absorbed moisture from the plating step, and increase the adhesion between the copper conductors and the base material.

Surprisingly, copper conductors produced using this method exhibited high resistance to thermal stress when tested in accordance with MIL-P-55110D. On an arbitrary, scale of 0 to 160, with low numbers being more desirable, the copper samples had a crack rating no higher than 4.

Electroless copper conductors manufactured with the present invention also exhibited unexpected and uniformly high ductility and have elongation in the range 28% to 30%.

While not wishing to be bound by theory, according to the present invention it is believed necessary for the N-heterocyclic compound employed to combine the function of being able to coordinate to copper and the function of being reactive with epoxy resin compounds in the same molecule. It is well known in the art that N-heterocyclic six membered ring compounds comprising $-NH_2$ groups form copper complexes. Equally well known is the utility of such N-heterocyclic compounds to react with epoxide groups in epoxy resins.

By firstly applying the N-heterocyclic compounds to the copper surface, wherein they coordinate to copper, and secondly, applying an epoxy resin containing dielectric to the treated surface, wherein the N-heterocyclic compound reacts with the epoxide groups in the dielectric, the dielectric is firmly bound to the copper surface.

In the present invention, it is surmised that the fully cured resist layer forms a barrier to prevent the melamine on the copper surface covered by the resist from eluting into the electroless copper solution. Since the resist employed in the present invention contains no melamine, and since the steps of processing the photoresist remove any excess melamine from the surfaces of copper to be plated, the electroless plating solution does not contact melamine. Thus, the tensile properties and resistance to thermal stress of the electroless copper deposits produced are sufficient to meet the rigid specifications required by IPC TECHNICAL REPORT IPC-TR-579 and MIL-P-55110D, respectively.

The following Examples will aid in illustrating and explaining the invention by describing the best mode contemplated for performing it and comparing to the procedures in the prior art. The Examples are for illustration only, and are not to be taken as limiting in any regard.

EXAMPLE 1

1. An 18"×24" copper-clad epoxy-glass laminate panel was cleaned, the panel thickness being 0.062" and having a plurality of 0.0135" through holes, to remove dirt/grease, fingerprints, etc. by immersion in Enplate PC 471 acid cleaner (Enthone, Inc) for 5 minutes at a temperature of 40° C.

2. The panel was rinsed thoroughly in aleionized water and without drying the panel was placed into an aqueous solution of 0.2 wt % melamine in deionized water maintained at 40° C.

3. The duration of the treatment was 5 minutes.

4. Following treatment with the melamine solution, excess solution was allowed to drain from the panels.

5. The treated panels were heated in an oven at 50° C. for 15 minutes.

6. APR8829R (Enthone) photoimageable resist substantially tree of amino-substituted S-triazine compounds was then applied to the dried panels, imaged and developed by conventional methods well known to those skilled in the art and described in Coombs.

7. Following resist application, panels were plated for 6 hours under the following conditions: An electroless copper solution was operated with the following formulation:

This solution is described in copending U.S. patent application No. 07/924,842 to Mayernik, filed Aug. 4, 1992 and herein incorporated by reference. The above application describes the utility of this solution formulation for providing electroless copper deposits of high tensile strength and thermal stress resistance.

| | | |
|---|---|---|
| $CuSO_4.5H_2O$ | (g/l) | 10 |
| $Na_4EDTA.2H_2O$ | (g/l) | 41 |
| NaOH | (pH at 25° C.) | 11.8 |
| Formaldehyde (37% solution) | (ml/l) | (2.2) |
| By-product $Na_2SO_4$ | (mol/l) | 0.25 |
| By-product NaOOCH | (mol/L) | 0.5 |
| Polyoxyethylene (MW = 1000) | (g/l) | 1 |
| $GeO_2$ | (mg/l) | 70 |
| $V_2O_5$ | (mg/l) | 2 |
| Air Injection (large bubbles) | (liters/min/liter of bath) | 0.07 |
| Air Injection (small bubbles) | (liters/min/liter of bath) | 0.14 |
| Temperature | (°C.) | 72 |

Large air bubbles came from a pipe with 0.6 mm diameter holes. Fine air bubbles came from a porous walled pipe. The plating bath was operated with a load of 1.5 dm of surface being plated per liter. Copper also was deposited on a stainless steel substratum to obtain a foil suitable for tensile testing. The rate of copper deposition was 6-7/μm/hr.

The copper deposited on the stainless steel substratum was dried for 1 hour at 160° C. After drying, a copper foil was removed from the stainless steel. A portion of the foil was used for tensile testing according to IPC 2.4.18B. The results are reported in Table 1. The percent elongation is reported as measured at the deposit thickness of 30 micrometers.

The plated-through holes in the printed wiring boards were subjected to the fluid sand thermal cycling test described in IPC-TR-579. In one cycle of the test, printed wiring boards are immersed in water at 25 ° C., withdrawn and the excess water removed, and immersed in a fluidized sand bath at 260° C. The boards are cycled to failure, which is an open circuit or a 10% increase in the resistance of the chain of plated-through holes.

The thermal stress resistance of the copper was evaluated according to MIL-P-5110D. The thermal stress test was performed on a sample having plated-through holes cut from the copper plated printed wiring board. The test consisted of: (a) drying the sample for 6 hours at 149° C.; (b) floating the sample on a molten solder bath at 288° C. for 10 seconds either once or four times, cooling to room temperature between each solder float; (c) microsectioning 5 plated-through holes; and (d) examining 4 corners of each microsectioned hole for cracks in the copper deposit using a microscope with 400x magnification.

A measurement system was specified to quantify the cracks in the plated-through holes. When cracks occurred, they occurred in the copper at the intersection of the hole wall with the laminate surface. Four intersections (corners) were examined in each plated-through hole. A value of 0, 1, 2, or 8 was assigned to each corner. A value of 0 corresponded to no crack; a value of 1 to a partial crack extending through less than 50% of the thickness of the copper deposit; a value of 2 to a hairline crack extending 50-100% through the copper thickness, and value of 8 to an open break extending completely through the copper which became filled with solder during the solder float. Each panel will therefore have a crack rating in the range from 0 to 160.

Immediately after plating, panels were air dried and evaluated for adhesion of resist to the copper surface by the cross-hatch tape test of IPC SMA840B. The adhesion of resist to copper is characterized on an arbitrary scale of 1 to 10. On this scale, a rating of 10 indicates excellent adhesion, with no sign of lifting or peeling; ratings of 8 and 9 are indicative of high adhesion, with only minor evidence of peeling of the resist; values of 6 and 7 are indicative of some resist peeling at the periphery of plated through holes and ratings of 5 and less indicate complete failure of the resist to adhere during the electroless plating cycle. Ratings of 8 or less result in failure of the printed circuit board. The results of adhesion testing are found in Table 3 and the results of copper property measurements are found in Tables 1 and 2.

EXAMPLE 2

By way of comparison with the prior art, Example 1 was repeated except that the photoresist used was APR 7335 photoimageable resist (Enthone) containing melamine APR 7335 photoresist is chemically identical to APR 8829R photoresist but comprises melamine. Example 2 also omitted the step of treating the copper surface with melamine prior to application of APR 7335 photoresist.

EXAMPLE 3

By way of comparison with the prior art, Example 1 was repeated except that the step of treating the copper surface with melamine prior to application of APR 8829R photoresist was omitted. After electrolessly plating copper deposits the photoresist adhesion was measured as in Example 1. The resist was observed to lift and peeled from the panels.

EXAMPLE 4

By way of comparison with the prior art, Example 1 was repeated except that benzotriazole was substituted for the melamine prior to application of APR 8829R photoresist. After electrolessly plating copper deposits, the photoresist adhesion was measured as in Example 1. The resist was observed to lift and peeled from the panels.

EXAMPLE 5

By way of comparison with the prior art, Example 1 was repeated except that a condensation polymer of formaldehyde and melamine (hexamethoxy methyl melamine, trade name Cymel 303) was substituted for the melamine prior to application of APR 8829R photoresist. After electrolessly plating copper deposits, the photoresist adhesion was measured as in Example 1. The resist was observed to lift and peeled from the panels.

EXAMPLE 6

By way of comparison with the prior art, the present invention was used to prepare a multilayer printed circuit board from inner layer cores and prepreg layers comprising epoxy polymers. An elucidation of the multilayer manufacturing process to which the present invention is applicable, to the extent that the subsequent description does not specifically describe such a process, is to be found in Printed Circuits Handbook, 3rd Edition, Chapter 34, Clyde F. Coombs, ed., McGraw-Hill, New York, which is incorporated herein by reference.

Inner layer cores having copper conductors on both outer surfaces were treated with a sulfuric acid microetch solution containing sodium persulfate for 5 minutes at 25° C. The solution composition was 10% sulfuric acid and 10% sodium persulfate in deionized water. They were then treated with PC 471 cleaner for 5 minutes, the solution being maintained at a temperature of 47° C. The inner layer cores were rinsed with water and then treated with a 0.2% aqueous solution of melamine under the same conditions as in Example 1. The cores were then allowed to drip dry. The cores were then heated in an oven for 30 minutes at a temperature of 100° C.

Each inner layer core was sandwiched between two sheets of epoxy-glass prepreg, Type 1417-65 with Style 2116 glass reinforcement and laminated using a conventional hydraulic press under the following conditions:
(a) One hour at 173° C. with an applied pressure of 300 psi. After one hour, the heat was turned off and the multilayer printed circuit was allowed to cool to 93° C. before removal from the press.

The resulting multilayer printed circuit boards were tested for adhesion between the inner layers and the prepreg sheet by the method of IPC 2.4.40. The test results are tabulated in Table 4.

EXAMPLE 7

Multilayer printed circuit boards were manufactured as in Example 6, except that no surface treatment of the copper conductors of the inner layer core was used. The resulting multilayer printed circuit boards were tested for adhesion between the inner layers and the prepreg sheet by the method of IPC 2.4.40. The test results are tabulated in Table 4.

EXAMPLE 8

Multilayer printed circuit boards were manufactured as in Example 6, except that the copper conductors of the inner layer core were treated to produce a brown oxide coating by methods well known to those skilled in the art and described in Coombs, Chapter 34. The resulting multilayer printed circuit boards were tested for adhesion between the inner layers and the prepreg sheet by the method of IPC 2.4.40. The test results are tabulated in Table 4.

EXAMPLES 9 and 10

The melamine surface treatment method of Example 2 was employed in order to demonstrate the improvement in adhesion to copper conductors obtained for solder resists comprising epoxy polymers and no melamine. In Examples 9 and 10, following electroless plating, adhesion of the solder resist was evaluated by the method of Example 1.

In Example 9 the resist used was a solder resist, trade name Probimer 61, commercially available from Ciba-Geigy Corporation, comprising an epoxy resin. This resist was used in place of the APR 8829R.

Example 10 used a solder resist of the formulation described in U.S. Pat. No. 4,510,276 to Leech et al, in place of the APR 8829R resist of Example 2. This resist is commercially known as PC 501 TM, available from Haven Corporation, Baltimore, Md.

The adhesion of the resists used in Examples 9 and 10 was measured by the same methods as in Example 2.

and the highest quality deposits will have crack ratings of 0–15.

TABLE 3

Adhesion Ratings

| Run # | Treatment Compound | Wt % | Solvent | T°,C. | Rating | Resist |
|---|---|---|---|---|---|---|
| 1 | Melamine | 0.2 | Deionized Water | 40 | 10 | APR8829R |
| 2 | None (Control) | | | | 8 | APR7335 |
| 3 | None (Control) | | | | 4–6 | APR8829R |
| 4 | Benzotriazole | 1 | Deionized Water | 20 | 4–6 | APR8829R |
| 5 | Cymel 303$^A$ | 5 | Water/Isopropanol | 20 | 7 | APR8829R |
| 6 | Melamine | 0.2 | Deionized Water | 40 | 10 | APR8829R |
| 7 | Melamine | 1 | Deionized Water | 70 | 9 | APR8829R |
| 8 | Melamine | 1 | Deionized Water | 70 | 8 | APR8829R |
| 9 | Curezol$^B$ | 1 | Water/Isopropanol | 43 | 8 | APR8829R |
| 10 | Melamine | 1 | 5% HCl | 67 | 7 | APR8829R |
| 11 | Guanidine | 1 | Water, pH 12.5 | 20 | 7 | APR8829R |
| 12 | Curezol$^B$ | 1 | Water/Iospropanol | 20 | 6 | APR8829R |
| 13 | PEI$^D$ | 1 | Deionized Water | 20 | 6 | APR8829R |
| 14 | Dipyridyl | 1 | Water/Isopropanol | 20 | 6 | APR8829R |
| 15 | Melamine | 1 | Water/Sulfamic Acid | 80 | 5 | APR8829R |
| 16 | 2,4 EMI$^C$ | 1 | Water/Isopropanol | 65 | 5 | APR8829R |
| 17 | None (Control) | | | | 4 | Probimer 61 |
| 18 | None (Control) | | | | 9 | PC 501 |
| 17 | Melamine | 0.2 | Water | 48 | 8 | Probimer 61 |
| 18 | Melamine | 0.2 | Water | 48 | 10 | PC 501 |

$^A$Hexamethoxy methyl melamine
$^B$2,4-diamino-6-(2'-methylimidazolyl-(1'))ethyl-s-triazine
$^C$2-ethyl, 4-methyl imidazole
$^D$Polyethyleneimine The results are shown in Table 3 and demonstrate improvement in adhesion over that obtained in the Examples in which no melamine surface treatment was employed.

TABLE 1

Test Results of Example 1.

| | % Elongation IPC 2.4.18B | Cycles Thermal Stress IPC TR-579 | Crack Rating (per MIL-P-55110D Floats on molten solder at 288° C.) One Float | Four Floats |
|---|---|---|---|---|
| Run 1. | 28 | — | 2 | 4 |
| Run 2. | 31 | 21 | 3 | 2 |
| Run 3. | 31 | 17 | 3 | 3 |

TABLE 2

Test Results of Example 2

| | % Elongation IPC 2.4.18B | Cycles Thermal Stress IPC TR-579 | Crack Rating (per MIL-P-55110D Floats on molten solder at 288° C.) One Float | Four Floats |
|---|---|---|---|---|
| Run 1. | 4.1 | 1 | 100 | 76 |
| Run 2. | 3.6 | 1 | 94 | 111 |
| Run 3. | 3.8 | 1 | 124 | 124 |

In the test results of Tables 1 and 2, a crack rating of less than 15 indicates a tough, ductile, copper deposit in which the five holes inspected had on average only one small partial crack after four thermal stress cycles.

A crack rating of 25 indicates a copper deposit that is intact after four thermal stress cycles, but has been strained sufficiently to form hairline cracks extending more than 50% through the copper deposit at one point or smaller, partial cracks extending around the rim of the hole.

A crack rating greater than 50 indicates cracks greater than 50% through the deposit and extending around the rim of the hole, and that the copper deposit did not have sufficient strength and ductility to permit the plated-through holes to survive four thermal stress cycles.

The tough copper deposit will have a crack rating less than 35 by this four cycle thermal stress test, a tougher deposit will have a crack rating less than 25, and the highest quality deposits will have crack ratings of 0–15.

TABLE 4

Multilayer Adhesion

| Example Number | Copper Treatment | Peel Strength in lbs/inch |
|---|---|---|
| 6 | Melamine, 0.2% solution | 8.5 average |
| 7 | No Treatment | 7 average |
| 8 | Brown Oxide | 11 |

By comparison with the control sample of Example 7, in which no copper surface treatment is made according to the present invention, it is demonstrated that an improvement in the adhesion of an epoxy containing prepreg can be obtained by the method of the present invention.

According to the present invention, the adherence of plating resists to copper surfaces is markedly improved with substantially no adhesion promoting substance released to the electroless copper solution. Thus copper deposits with excellent resistance to thermal stress, ductility and tensile strength can be obtained.

What is claimed is:

1. In a method for adhering an epoxy-resin containing resist to a copper surface, in which method the copper surface is coated with a photoresist layer, the resist layer is imagewise exposed to actinic radiation, the resulting resist layer is developed and the resulting resist layer is hardened, the improvement further comprising the steps of:
  (a) contacting the copper surface with a N-heterocyclic six membered ring compound comprising —NH$_2$ groups, said N-heterocyclic compound characterized in that it coordinates to a copper surface and is sufficiently reactive with epoxy resin comprising resists to prevent peeling of said resists from the copper surface when immersed in an electroless plating solution; and
  (b) allowing the copper surface comprising said N-heterocyclic compound to dry prior to application of said resist.

2. The method of claim 1 wherein the N-heterocyclic compound is selected from the group consisting of melamine, a condensation polymer of formaldehyde with melamine, and 2,4-diamino-6-(2'-methylimidazolyl-(1'))ethyl-s-triazine.

3. The method of claim 2 wherein the copper surface is contacted with an aqueous solution comprising melamine.

4. In a method of manufacturing an electroless copper conductor pattern of a printed circuit board by a partially additive process, from a plating bath containing a copper compound, a complexing agent for copper, a reducing agent for copper, a pH-adjusting agent, and one or more addition agents, and in which method a plating resist is used to define the conductor pattern; the improvement for producing an electroless copper conductor capable of withstanding at least 5 repetitive thermal cycles of immersion in water at 25° C. followed by immersion in a fluidized sand bath at 260° C. without failure, the improvement further comprising the steps of:
  (a) contacting the copper surface with a N-heterocyclic six membered ring compound comprising —NH$_2$ groups, said N-heterocyclic compound characterized in that it coordinates to a copper surface and is sufficiently reactive with epoxy resin comprising plating resists to prevent peeling of said resists from the copper surface when immersed in an electroless plating solution; and
  (b) allowing the copper surface comprising said N-heterocyclic compound to dry prior to application of said photoresist.

5. The method of claim 4 wherein the N-heterocyclic compound is selected from the group consisting of melamine, a condensation polymer of formaldehyde with melamine, and 2,4-diamino-6-(2'-methylimidazolyl-(1'))ethyl-s-triazine.

6. The method of claim 5 wherein the copper surface is contacted with an aqueous solution comprising melamine.

7. The method of claim 4 wherein the copper conductor is further characterized by having a crack rating of no higher than 10 when measured in accordance with IPC TECHNICAL REPORT IPC-TR-579.

8. In a method for adhering a polymer layer comprising an epoxy-resin to a copper conductor of an inner layer, in which method the copper surface is laminated to said polymer layer under heat and pressure, the improvement comprising the steps of:
  (a) contacting the copper surface with a N-heterocyclic six membered ring compound comprising —NH$_2$ groups, said N-heterocyclic compound characterized in that it coordinates to a copper surface and is sufficiently reactive with epoxy resin comprising polymer layers to provide a peel strength of greater than 7 lbs/in to an inner layer when tested in accordance with IPC 2.4.40; and
  (b) allowing the copper surface comprising said N-heterocyclic compound to dry prior to lamination.

9. The method of claim 8 wherein the N-heterocyclic compound is selected from the group consisting of melamine, a condensation polymer of formaldehyde with melamine, and 2,4-diamino-6-(2'-methylimidazolyl-(1'))ethyl-s-triazine.

10. The method of claim 9 wherein the copper surface is contacted with an aqueous solution comprising melamine.

* * * * *